US007096442B2

(12) United States Patent
Lu et al.

(10) Patent No.: US 7,096,442 B2
(45) Date of Patent: Aug. 22, 2006

(54) OPTIMIZING IC CLOCK STRUCTURES BY MINIMIZING CLOCK UNCERTAINTY

(75) Inventors: Aiguo Lu, Pleasanton, CA (US); Ivan Pavisic, San Jose, CA (US); Nikola Radovanovic, Santa Clara, CA (US)

(73) Assignee: LSI Logic Corporation, Milpitas, CA (US)

( * ) Notice: Subject to any disclaimer, the term of this patent is extended or adjusted under 35 U.S.C. 154(b) by 404 days.

(21) Appl. No.: 10/616,623

(22) Filed: Jul. 10, 2003

(65) Prior Publication Data

US 2005/0010884 A1    Jan. 13, 2005

(51) Int. Cl.
*G06F 17/50* (2006.01)
*G06F 19/00* (2006.01)

(52) U.S. Cl. .................. 716/6; 716/7; 716/10; 716/13; 703/16

(58) Field of Classification Search ............ 716/6, 716/7, 10, 13; 703/16
See application file for complete search history.

(56) References Cited

U.S. PATENT DOCUMENTS

| 4,924,430 | A | * | 5/1990 | Zasio et al. ................ 716/6 |
| 5,258,660 | A | * | 11/1993 | Nelson et al. ............ 327/141 |
| 5,298,866 | A | * | 3/1994 | Kaplinsky ................. 327/261 |
| 5,414,381 | A | * | 5/1995 | Nelson et al. ............ 327/262 |
| 5,452,239 | A | * | 9/1995 | Dai et al. ................... 703/19 |
| 5,467,040 | A | * | 11/1995 | Nelson et al. ............ 327/276 |
| 5,475,830 | A | * | 12/1995 | Chen et al. ................. 716/16 |
| 5,608,645 | A | * | 3/1997 | Spyrou ........................ 716/6 |
| 5,649,167 | A | * | 7/1997 | Chen et al. ................. 703/23 |
| 5,715,172 | A | * | 2/1998 | Tzeng ......................... 716/6 |
| 5,835,751 | A | * | 11/1998 | Chen et al. ................. 716/16 |
| 5,852,640 | A | * | 12/1998 | Kliza et al. ............... 375/356 |
| 5,936,867 | A | * | 8/1999 | Ashuri ........................ 716/6 |
| 6,090,150 | A | * | 7/2000 | Tawada ...................... 703/19 |
| 6,205,571 | B1 | * | 3/2001 | Camporese et al. ......... 716/2 |
| 6,219,384 | B1 | * | 4/2001 | Kliza et al. ............... 375/258 |
| 6,266,803 | B1 | * | 7/2001 | Scherer et al. ............. 716/12 |

(Continued)

FOREIGN PATENT DOCUMENTS

JP    09218888 A  *  8/1997

OTHER PUBLICATIONS

NA9402189, "Process-Variation-Tolerant Zero Skew Clock Routing", IBM Technical Disclosure Bulletin, vol. 37, No. 2A, Feb. 1994, pp. 189-198 (10 pages).*

(Continued)

*Primary Examiner*—Phallaka Kik
(74) *Attorney, Agent, or Firm*—Westman, Champlin & Kelly

(57) ABSTRACT

Clock uncertainty between a receiving cell and a launching cell of a net is estimated by back-tracing a first path from the receiving cell toward the clock source and marking each cell having a predetermined characteristic along the first path. A second path from the launching cell toward the clock source is back-traced to a common one of the marked cells having the predetermined characteristic. Clock uncertainty is calculated based on the portion of the first path from the common marked cell having the predetermined characteristic to the receiving cell. Clock uncertainty is calculated if a slack does not exceed a margin value. In one embodiment, a clock net in the form of a tree is optimized by forcing a first buffer to the center of gravity of a plurality of buffers having nets without timing violations to maximize a common path from the root to the forced buffer and minimize the non-common paths from the forced buffer to the leaves, thereby minimizing clock uncertainty.

14 Claims, 6 Drawing Sheets

U.S. PATENT DOCUMENTS

| | | | |
|---|---|---|---|
| 6,305,001 B1 | 10/2001 | Graef | |
| 6,311,313 B1* | 10/2001 | Camporese et al. | 716/6 |
| 6,324,671 B1* | 11/2001 | Ratzel et al. | 716/1 |
| 6,341,363 B1* | 1/2002 | Hasegawa | 716/6 |
| 6,487,697 B1 | 11/2002 | Lu et al. | |
| 6,518,788 B1* | 2/2003 | Kasahara | 326/46 |
| 6,536,022 B1* | 3/2003 | Aingaran et al. | 716/5 |
| 6,550,044 B1 | 4/2003 | Pavisic et al. | |
| 6,550,045 B1 | 4/2003 | Lu et al. | |
| 6,564,361 B1 | 5/2003 | Zolotykh et al. | 716/8 |
| 6,578,182 B1* | 6/2003 | Kurokawa et al. | 716/6 |
| 6,606,736 B1* | 8/2003 | Kobayashi et al. | 716/10 |
| 6,618,816 B1* | 9/2003 | Ido et al. | 713/503 |
| 6,651,224 B1* | 11/2003 | Sano et al. | 716/2 |
| 6,665,845 B1* | 12/2003 | Aingaran et al. | 716/5 |
| 6,684,373 B1* | 1/2004 | Bodine et al. | 716/6 |
| 6,711,724 B1* | 3/2004 | Yoshikawa | 716/6 |
| 6,799,308 B1* | 9/2004 | You et al. | 716/6 |
| 6,810,505 B1 | 10/2004 | Tetelbaum | |
| 6,836,874 B1* | 12/2004 | Batchelor et al. | 716/6 |
| 6,880,141 B1* | 4/2005 | Tetelbaum | 716/6 |
| 6,910,194 B1* | 6/2005 | Mielke et al. | 716/6 |
| 6,941,532 B1* | 9/2005 | Haritsa et al. | 716/6 |
| 6,954,915 B1* | 10/2005 | Batchelor | 716/6 |
| 2002/0029361 A1* | 3/2002 | Kasahara | 714/726 |
| 2002/0073389 A1* | 6/2002 | Elboim et al. | 716/6 |
| 2002/0104035 A1* | 8/2002 | Burns et al. | 713/500 |
| 2002/0161947 A1* | 10/2002 | Ikeda et al. | 710/38 |
| 2003/0051222 A1 | 3/2003 | Williams et al. | |
| 2003/0070151 A1* | 4/2003 | Kurokawa et al. | 716/6 |
| 2003/0074642 A1* | 4/2003 | Haritsa et al. | 716/6 |
| 2003/0074643 A1* | 4/2003 | Schmitt et al. | 716/6 |
| 2003/0115493 A1* | 6/2003 | Wong et al. | 713/322 |
| 2003/0121013 A1* | 6/2003 | Moon et al. | 716/6 |
| 2003/0149943 A1* | 8/2003 | Yoshikawa | 716/1 |
| 2003/0159118 A1* | 8/2003 | Lindkvist | 716/5 |
| 2003/0177464 A1* | 9/2003 | Takechi et al. | 716/10 |
| 2003/0212971 A1* | 11/2003 | Rodgers et al. | 716/6 |
| 2004/0003360 A1* | 1/2004 | Batchelor et al. | 716/6 |
| 2004/0015801 A1* | 1/2004 | Mielke et al. | 716/6 |
| 2004/0025129 A1* | 2/2004 | Batchelor | 716/6 |
| 2004/0107408 A1* | 6/2004 | Sano et al. | 716/2 |
| 2004/0123259 A1* | 6/2004 | You et al. | 716/6 |
| 2004/0268279 A1* | 12/2004 | Oleksinski et al. | 716/6 |
| 2005/0000108 A1 | 1/2005 | Lu et al. | |
| 2005/0132313 A1* | 6/2005 | Lindkvist | 716/6 |

OTHER PUBLICATIONS

Feehrer, "The Effect of Propagation Delay Uncertainty on the Speed of Time-of-Flight Digital Optoelectronic Circuits", Journal of Lightwave Technology, vol. 14, No. 12, pp. 2698-2713, Dec. 1996.*

Pullela et al., "Moment-Sensitivity-Based Wire Sizing for Skew Reduction in On-Chip Clock Nets", IEEE Transactions on Computer-Aided Design of Integrated Circuits and Systems, vol. 16, No. 2, pp. 210-215, Feb. 1997.*

Balatsos et al., "Low-Skew Clock Generator with Dynamic Impedance and Delay Matching", IEEE International Solid-State Circuits Conference, Feb. 15, 1999, pp. 182-183.*

Feehrer, "The Effect of Propagation Delay Uncertainty on the Speed of Time-of-Flight Digital Optoelectronic Circuits", Journal of Lightwave Technology, vol. 14, No. 12, Dec. 1996, pp. 2698-2713.*

Lee, "A Multilevel Parasitic Interconnect Capacitance Modeling and Extraction for Reliable VLSI On-Chip Clock Delay Evaluation", IEEE Journal of Solid-State Circuits, vol. 33, No. 4, Apr. 1998, pp. 657-661.*

* cited by examiner

OPTIMIZING IC CLOCK STRUCTURES BY MINIMIZING CLOCK UNCERTAINTY

FIELD OF THE INVENTION

This invention relates to designing clock logics in integrated circuits or chips, and particularly to optimizing clock logics during the design phase by minimizing clock uncertainty.

BACKGROUND OF THE INVENTION

Integrated circuits (ICs) comprise a large number of circuit elements, such as transistors, interconnected by a large number of wires. Some elements ("drivers") drive other elements ("driven elements"). Fanout of a given driver is the number of driven elements coupled to the output of the driver.

The "ramptime" of a driven element is the time required to drive a driven element to operation. Ramptime depends on the amount of capacitance and resistance "seen" by the driver, which in turn depends on the number of driven elements connected to the output of the driver and the length of the wires that interconnect the driver with its driven elements. If a driver's load exceeds a design threshold, the ramptime for the driven elements will also exceed a threshold.

It is common to selectively insert buffers, in the form of additional drivers, between the driver and the driven elements to reduce the number of driven elements for a given driver, thereby minimizing capacitance and resistance "seen" by that driver and minimizing timing violations. However, each added buffer increases power consumption of the integrated circuit. Consequently, it is desirable to minimize the number of buffers. Moreover, because each buffer introduces a delay in signal propagation, it is also desirable to minimize the number of levels of buffers and to minimize the overall interconnect length.

In the hierarchical design flow of digital systems, interconnect information is available only at lower levels of the design process. For example, coupling capacitance information is available only after detailed routing is completed, and not at the higher logic synthesis, placement and global routing stages. While lower levels of the design process provide more detailed interconnect information, the circuit design is usually so advanced at the lower levels that only minimal changes to the circuit structure can be performed to improve performance.

If a clock network is implemented after detailed routing, it is difficult to implement clock logic changes without changing the placement and the routing of data logics. It is also difficult to place the buffers and route the clock nets simultaneously in order to take into account the coupling and other detailed information of the chip fabrication and materials ("silicon information").

To achieve the overall optimal results from the design specification to implementation, it is crucial to estimate the interconnect information at higher levels of the design process, such as during the placement stage and before routing, where there exists more freedom to restructure the design. Clock logics are very important and also sensitive to the timing closure of a design. A mis-estimation of clock delays may cause thousands or more violated timing paths, and attempts to correct a poorly routed clock net may inadvertently cause other timing violations. Therefore, good delay estimations for the clock logics are important at early stages of the design process. It is also important to implement the clock logics so that they are robust with respect to the interconnect implementations in fabrication of the chip.

A calculated clock delay will unavoidably have estimation errors. To compensate this estimation error, a "clock uncertainty" factor is employed in the estimation of clock delays. To make sure that the circuit under design will operate satisfactorily when implemented into a chip, the value of clock uncertainty is usually set conservatively. However, a conservative clock uncertainty value leads to other problems, such as adding unnecessary buffers to fix timing violations.

SUMMARY OF THE INVENTION

The present invention is directed to a technique for an early estimation of clock delay, and for reduction of estimation errors. The technique is useful in design optimization tools, and because delay changes dynamically during the optimization process, the developed technique is efficient in computation and memory usage.

In one embodiment of the invention, clock uncertainty between a receiving cell and a launching cell of a net is estimated by back-tracing a first path from the receiving cell toward the clock source. Each cell in the first path having a predetermined characteristic (e.g., in a critical path) is marked. A second path from the launching cell is back-traced toward the clock source to a common of the marked cells having the predetermined characteristic (e.g., first marked cell). Clock uncertainty is calculated based on delay associated with the first path between the common marked cell and the receiving cell.

In preferred environments, there are a plurality of data launching cells capable of launching data to a data receiving cell. The second path is back-traced from each launching cell and clock uncertainty is calculated for each data path between the plurality of launching cells and the receiving cell. The maximum value of clock uncertainty is selected as a clock uncertainty for the receiving cell.

In some embodiments, a first clock delay between the clock source and the launching cell is calculated, and a second clock delay between the clock source and the receiving cell is identified. A data delay between the launching cell and the receiving cell is calculated, and a slack is calculated based on the first and second clock delays and the data delay. Clock uncertainty is calculated if the slack does not exceed a predetermined value.

In some embodiments, buffer placement to the clock net is optimized by forcing a buffer to the center of gravity of a plurality of inserted buffers driving respective clock nets without timing violations. The path between the root and the forced buffer defines a common path of maximum length to the leaves so that the non-common paths between the inserted buffer and the leaves is minimized, thereby minimizing clock uncertainty.

In other embodiments a computer having a computer useable medium has a computer readable program containing code that causes the computer to perform the process.

DETAILED DESCRIPTION OF THE PREFERRED EMBODIMENTS

Figure 1:
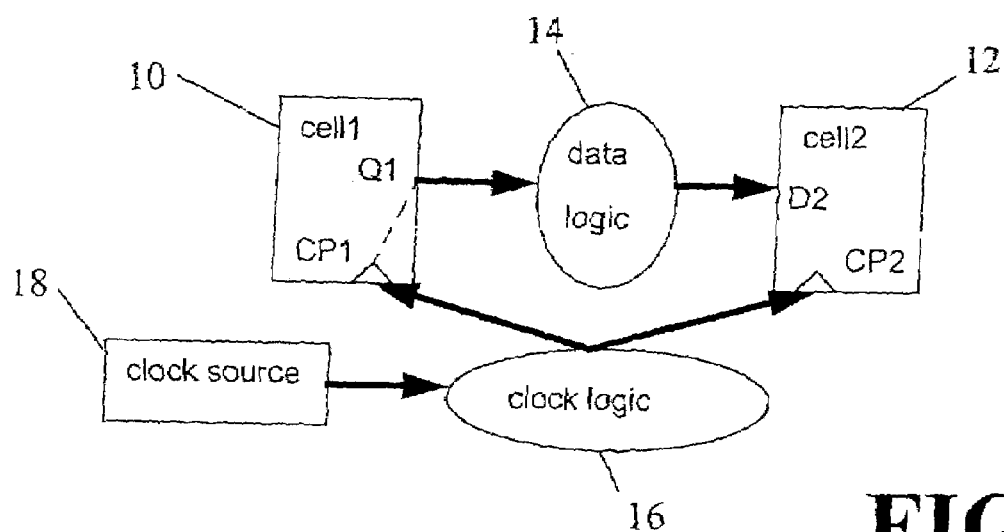
FIGS. 1–4 are diagrams useful in explaining features of the present invention.

FIG. 1 illustrates a portion of an integrated circuit design having two sequential cells 10 and 12, data logics 14 and clock logics 16. If the circuit operates at frequency 400 MHz, the clock cycle, T, is 2.5 ns (nanoseconds). The data path delay, $D_{data}$, is the delay from clock pin CP1 in cell 10, through pin Q1 in cell 10 and data logic 14, to data pin D2 in cell 12. Clock delay, $D_{clk2}$, is the delay from clock source 18, though clock logic 16, to clock pin CP1, and clock delay, $D_{clk2}$, is the delay from clock source 18, through clock logic 16, to clock pin CP2. If $$D_{clk1}+D_{data}+\text{setup}+\text{uncertainty}-D_{clk2}>T, \quad (1)$$

where setup is a constant dependent on the technology and cell type, then the path ending at pin D2 has a timing violation. In other words, this design cannot work at the frequency of 400 MHz (but might operate at a lower frequency).

The value of uncertainty represents the maximal clock delay estimation errors. (As mentioned above, the clock delay estimation at the placement stage cannot be accurate because no routing information is available.) Larger timing violations may occur where the value of uncertainty is greater; large timing violations is minimized if the value of uncertainty is small.

The value of uncertainty can be quite large if the clock network delay is large. For example, if the clock network delay is 4 ns and, in the worst case, the estimation error is 15% of the clock network delay, the uncertainty value can be as high as 0.15*4=0.6 ns. Considering the clock cycle (T) is only 2.5 ns for a 400 MHz frequency, the uncertainty value is 24% of the clock cycle. Thus, the uncertainty value plays an important role in the timing closure of the design process.

The present invention provides an analysis approach for reducing the uncertainty value based on the clock network topology, rather than applying the worst case percentage. A robust clock network can be implemented to further reduce the uncertainty value.

Figure 2:
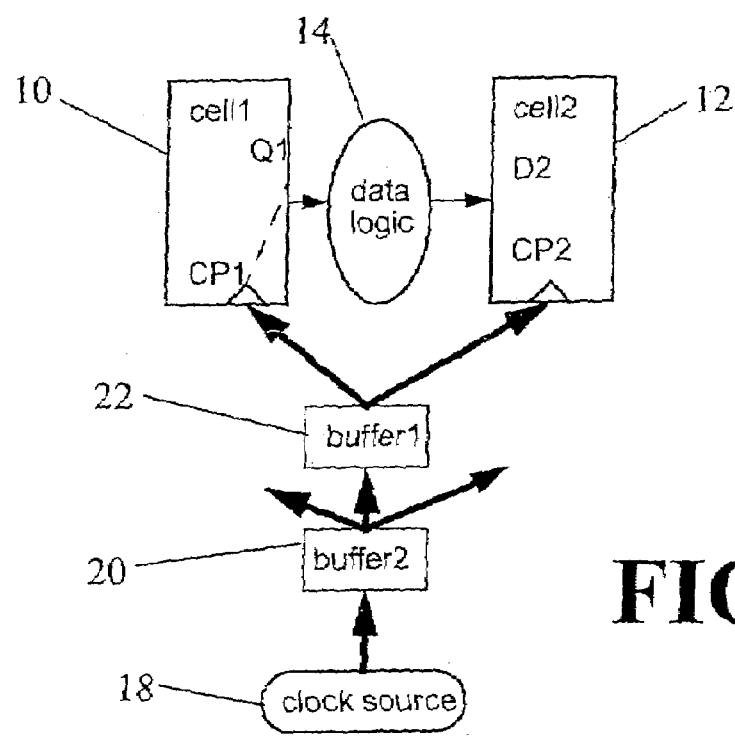
Figure 3:
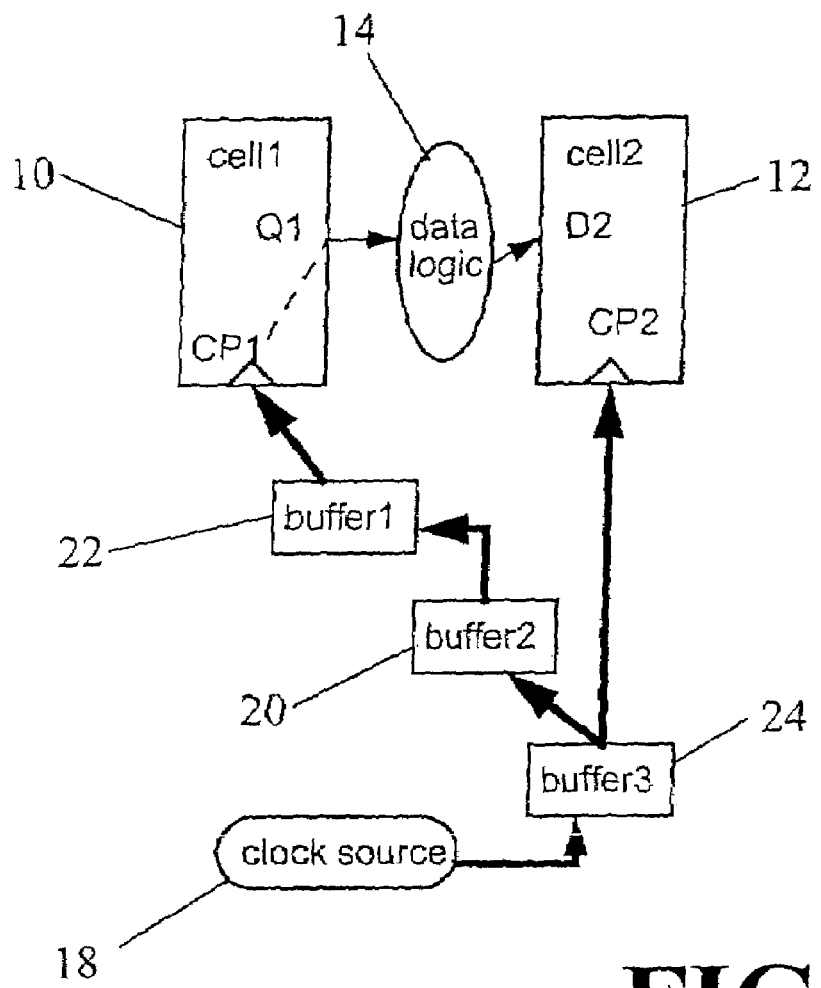

FIGS. 2 and 3 illustrate certain principles of the present invention. In FIG. 2, the clock path to pin CP1 in cell 10 is from clock source 18, through buffer 20 labeled "buffer2" and buffer 22 labeled "buffer1", to pin CP1. The clock path to pin CP2 in cell 12 is from clock source 18, through buffer 20 and buffer 22, to pin CP2. It is clear that both paths have a common part, which is from clock source 18 through buffer 22. From Equation (1), the entire clock delay impact to the timing violation is $D_{clk1}-D_{clk2}$, where $D_{clk1}=D_{common}+d_{cp1}$ and $D_{clk2}=D_{common}+d_{CP2}$, where $D_{common}$ is the delay from clock source 18 through buffer 22, $d_{CP1}$ is the delay from buffer 22 to pin CP1, and $d_{CP2}$ is the delay from buffer 22 to pin CP2. Therefore $$(D_{clk1}-D_{clk2})=D_{common}+d_{CP1}-(D_{common}+d_{CP2})=d_{CP1}-d_{CP2} \quad (2)$$

This indicates that $D_{common}$ (i.e., the common part of clock delays in both clock paths to pins CP1 and CP2) does not have any impact on the timing violation. So when uncertainty is being estimated, $D_{common}$ can be ignored. Consequently, a larger $D_{common}$ will provide a smaller uncertainty.

In FIG. 2, $D_{common}$ accounts for a major part of the clock delay, so uncertainty is small for the data path from pin CP1 to pin D2. However in FIG. 3, the common part of the clock paths is only from clock source 18 through buffer 24. In this case, $D_{common}$ is small and uncertainty is large. Therefore it is important to analyze uncertainty based on the specific paths. By ignoring $D_{common}$ in calculating uncertainty, confidence of the clock uncertainty can be increased.

Figure 4:
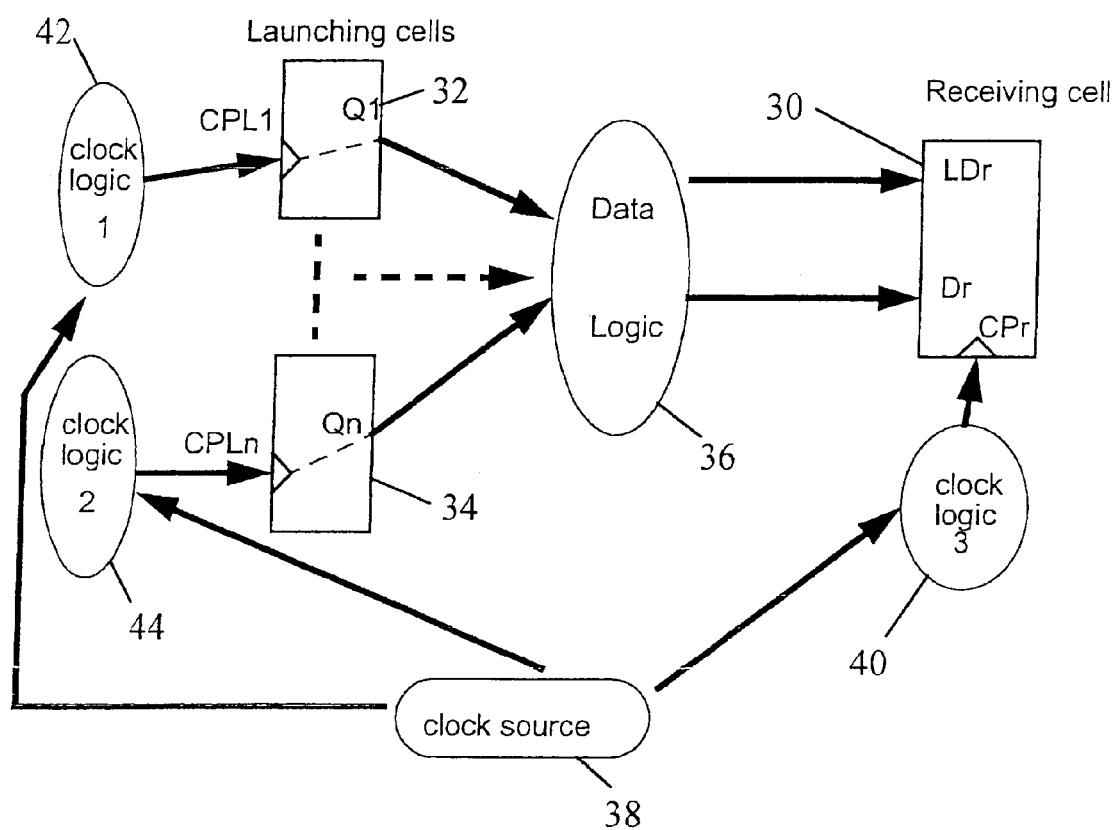

FIG. 4 illustrates a more general situation of a receiving cell 30 receiving data from each of a plurality of launching cells 32, . . . ,34. Receiving cell 30 has a plurality of path ending points defined by pins $LD_r$ and $D_r$ receiving data from launching cells 32, . . . ,34. A plurality of n pins $CPL_1, \ldots, CPL_n$ Of launching cells 32, . . . ,34 define path starting points for up to n data paths through data logic 36 to each ending point $LD_r$ and $D_r$ in receiving cell 30. Thus, there may be a data path from each starting point $CPL_1$, $CPL_2, \ldots, CPL_n$, to path ending point $LD_r$ and from each starting point $CPL_1, CPL_2, \ldots, CPL_n$ to path ending point $D_r$.

Clock logic 40 supplies clock signals from clock source 38 to pin $CP_r$ of receiving cell 30, and n clock logics 42, . . . ,44 supplies clock signals from clock source 38 to pins $CPL_1, \ldots, CPL_n$ of launching cells 32, . . . ,34. Clock logics 40, 42 and 44 may have common elements like buffer 24 in FIG. 3, as well as distinct elements like buffers 20 and 22 in FIG. 3, and the common elements between logics 40 and 42 may be different from the common elements between logics 40 and 44. Consequently, there are different common clock logic delays $D_{common-i}$ for clock paths from different starting points $CPL_i$, where $i \in (1, 2, \ldots, n)$.

It is time-consuming, and therefore impractical, to analyze and update each $D_{common-i}$ on a path by path with an optimization tool. But it is also unnecessary to extract every path-based uncertainty because most paths are not timing-critical (in other words they are not likely to become timing violated paths).

To understand the calculation of uncertainty according to the present invention, the parameters slack, margin and coef are defined.

Slack is a measure of a potential timing violation for a given data path, and is defined as the clock cycle period, T, less the sum of the data path delay, $D_{data}$, the difference in clock delay, $D_{clk1}-D_{clk2}$, setup and uncertainty:

$$\text{slack}=T-\{D_{data}+(D_{clk1}-D_{clk2})+\text{setup}+\text{uncertainty}\}.$$

A timing violation might occur if the sum of the data path delay, $D_{data}$, the difference in clock path delay, $D_{clk1}-D_{clk2}$, setup and uncertainty exceed the clock cycle period, T, that is, if slack <0. Thus in FIG. 3, the data path from pin Q1 (starting point) in cell 10 to pin D2 (ending point) in cell 12 has a potential timing violation if slack <0.

Margin is a pre-determined value based on whether the time analysis is for setup time or hold time. For example, if the time analysis is for setup time, margin might be 2 ns, whereas if the time analysis is for hold time, margin might be 1 ns.

Coef is a user-specified parameter, which indicates the percentage-wise possible delay estimation errors at the placement stage. For example, if coef=0.15 (15%) and the clock delay is 3 ns, the worst case uncertainty=0.15×3=0.45 ns.

$D_{uncertainty-i}$ is the calculated clock uncertainty value from i-th launching cell to one path ending point in the receiving cell under analysis.

Figure 5:
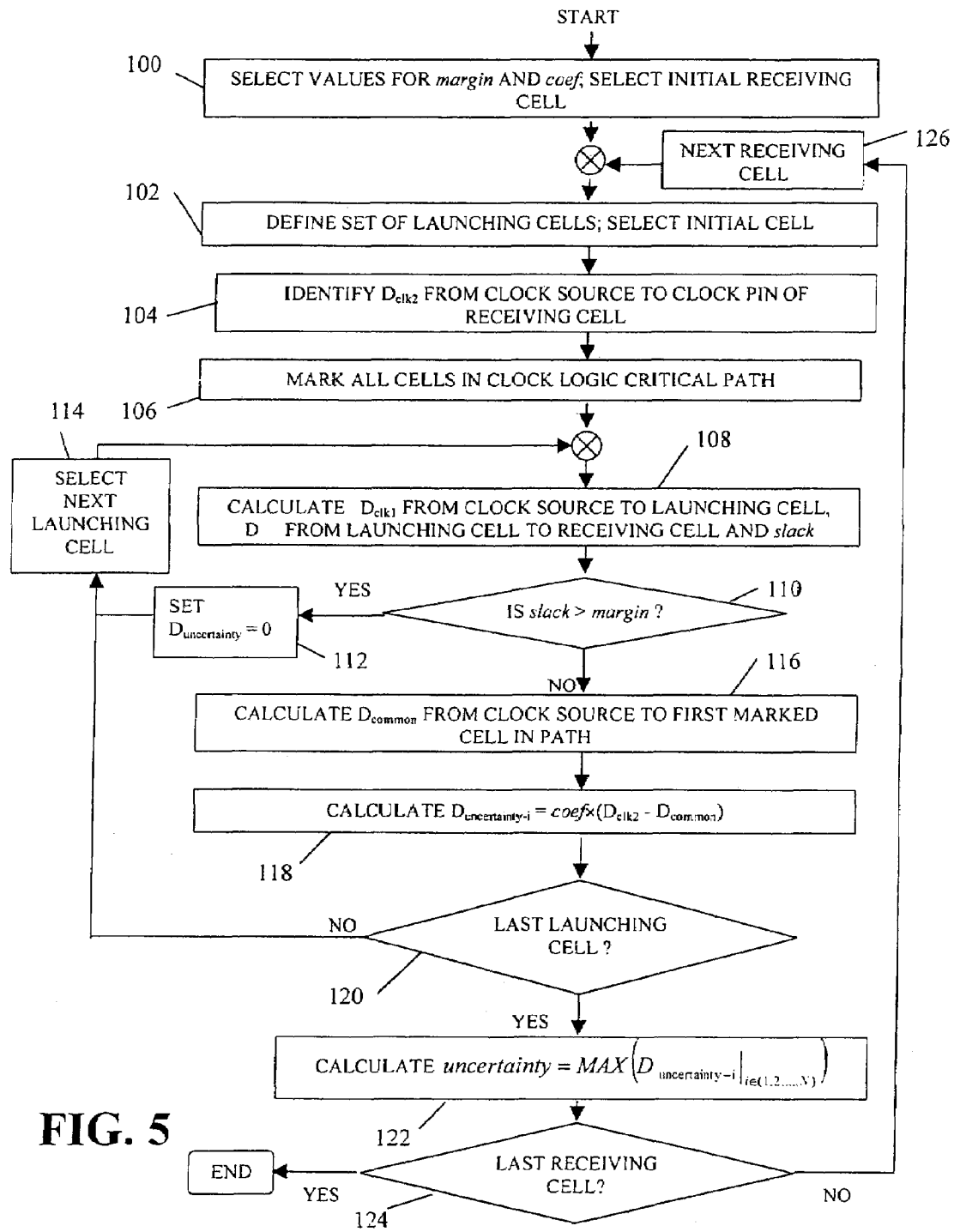
FIG. 5 is a flowchart of a process for calculating an uncertainty parameter in accordance with an embodiment of the present invention.

FIG. 5 is a flowchart of a process for calculating the value of uncertainty according to an embodiment of the present invention. At step 100, values for margin and coef are selected and an initial receiving cell, such as cell 30 in FIG. 4, is selected. Cell 30 is a data receiving cell, such as a flip-flop, memory, etc. At step 102, the data path is back traced through data logic 36 to identify all data launching cells 32 and 34 that launch data to the data receiving cell under consideration. One of those cells, such as cell 32, is selected, thereby selecting a data path through data logic 36 from cell 32 to cell 30 for consideration.

At step 104, the delay, $D_{clk2}$, from clock source 38 to the clock pin $CP_r$ of receiving cell 30 is identified. At step 106 the clock path is back traced through clock logic 40 to clock source 38 and each intermediate cell in the clock logic that is in a "critical path" to pin $CP_r$ is marked. An intermediate cell in the clock logic is in the critical path if the arrival time of a signal from clock source 38 to the intermediate cell, plus the time required to propagate a signal from the intermediate cell to pin $CP_r$ of the receiving cell is equal to clock delay $D_{clk2}$.

At step 108, the clock delay, $D_{clk1-i}$, from the clock source 38 to the clock pin of the selected launching cell 32 is calculated. Also, the data logic delay $D_{data-i}$ from the selected launching cell 32 to receiving cell 30 end point is calculated. As will become evident, the clock delay, $D_{clk1-i}$, and data logic delay, $D_{data-i}$, are calculated for each launching cell i to the receiving cell.

The $Slack_i$ for the data path from the respective i-th launching cell to the receiving cell is calculated as $$Slack_i = T - D_{clk1-i} - D_{data-i} - \text{setup} + (1-\text{coef}) \times D_{clk2}.$$

If, at step 110, $slack_i$>margin, the launching cell (e.g., cell 32) can be ignored at step 112, that is, $D_{uncertainty-i}=0$, and next launching cell (e.g., cell 34) will be selected at step 114.

If at step 110 $slack_i \leq$margin, then at step 116 the clock circuit is back traced from the clock pin $CPL_i$ of i-th launching cell (such as cell 32) through the respective clock logic (such as logic 42) to clock source 38. Upon reaching the first marked cell, namely the cell that was marked at step 106 and first encountered in the back tracing of step 116, a clock delay, $D_{common-i}$, is calculated from clock source 38 to that marked cell. The selected marked cell is that cell that is electrically closest to the launching cell, and hence represents the marked cell of the longest common clock path to both the launching i and the receiving cell. At step 118, a clock uncertainty for launching cell i is calculated as $D_{uncertainty-i}=\text{coef} \times (D_{clk2}-D_{common-i})$.

At step 120, if all of the launching cells i in the set identified at step 102 have not been considered, then the process loops to step 114 to select the next launching cell for the receiving cell being considered. The process thus iterates to calculate $D_{uncertainty-i}$ for each launching cell capable of launching data to the receiving cell under consideration. When the last launching cell has been considered at step 120, the value of uncertainty is selected at step 122 as the maximum value of $D_{uncertainty-i}$ for all launching cells i to the receiving cell, thus representing the uncertainty for the path ending point under analysis:

$$\text{uncertainty} = \text{MAX}(D_{uncertainty-i}|_{i \in (1,2,\ldots N)}),$$

where 1, 2, . . . , N are the launching cells.

The value of uncertainty is applied to Equation 1 for the timing analysis for the path end point.

To complete analysis of the entire integrated circuit design, at step 124 if the receiving cell under consideration is not the last receiving cell, the process advances to step 126 to select the next receiving cell and repeat the process. The process ends when, at step 124, the last receiving cell has been considered.

Figure 6:
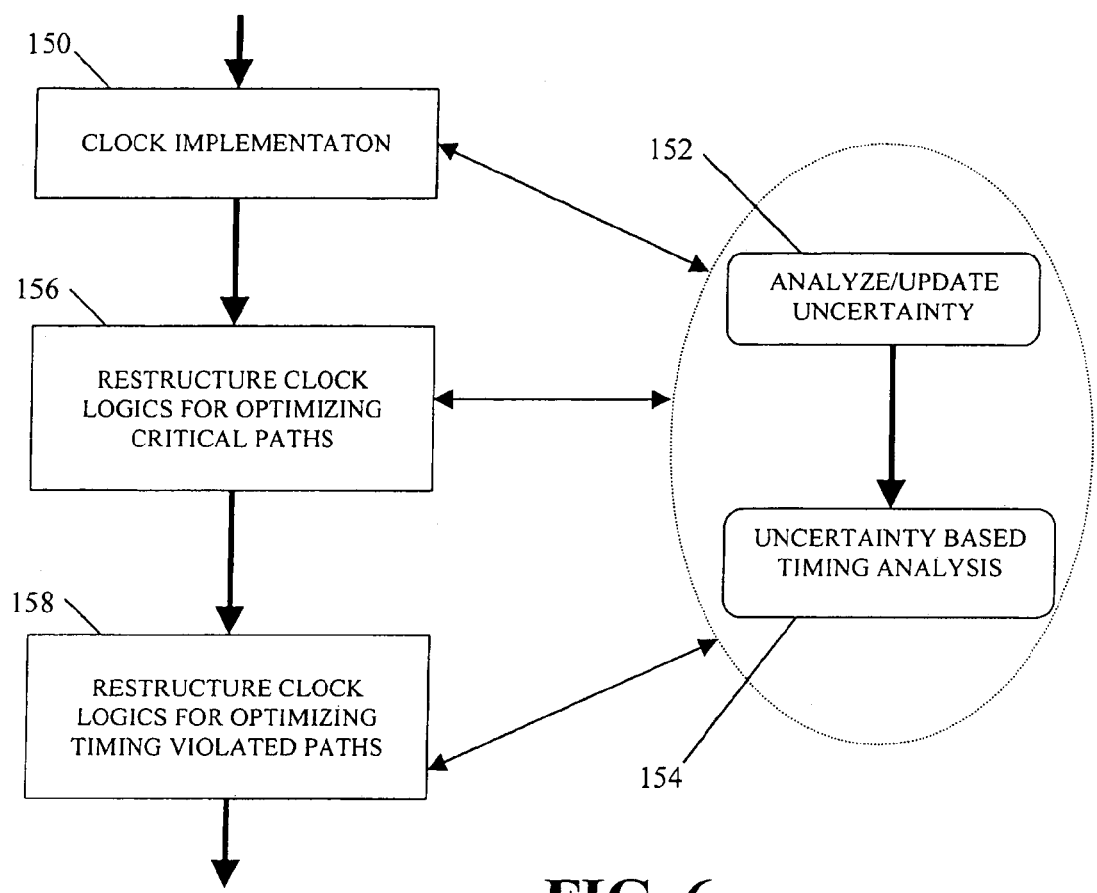
FIG. 6 illustrates application of the application of uncertainty based to optimization of clock logic.

The value of uncertainty is used in Equation 1 for timing analysis for each path end point of the integrated circuit. The process is a dynamic process, used to update the clock uncertainty during the structuring and restructuring of the clock net. As shown in FIG. 6, the uncertainty is analyzed and updated at each of the three main phases of clock synthesis. At the clock implementation stage 150, which includes initial cell placement for the clock net, uncertainty is calculated for each end point at step 152, as described in FIG. 5, and Equation 1 is executed at step 154 to perform timing analysis. Based on the results of the timing analysis, the cell placement might be changed at phase 150.

After the cells of the clock network are placed, critical paths of the clock logic are identified and optimized at phase 156. The processes of steps 152 and 154 are again executed during the restructure of the clock logic at phase 156. Similarly, the processes of steps 152 and 154 are executed during the third phase 158 when the clock logic is optimized for timing violated paths. Hence, the process is performed during the cell placement and wire routing phase 150, during the phase 156 of optimizing critical paths, and during the phase 158 of minimizing timing violation paths. After each phase of the synthesis, clock uncertainty will be analyzed and updated based on the current clock network topology and the over-all delay (clock logic delay and data logic delay) information.

As indicated by Equation 2, different clock structures will have quite different clock uncertainties. Thus, the clock structure of FIG. 2 has a small clock uncertainty, whereas the clock structure of FIG. 3 has a large clock uncertainty. A robust clock net can be constructed as a clock tree to reduce estimation errors during the clock implementation phase (FIG. 6).

Figure 7:
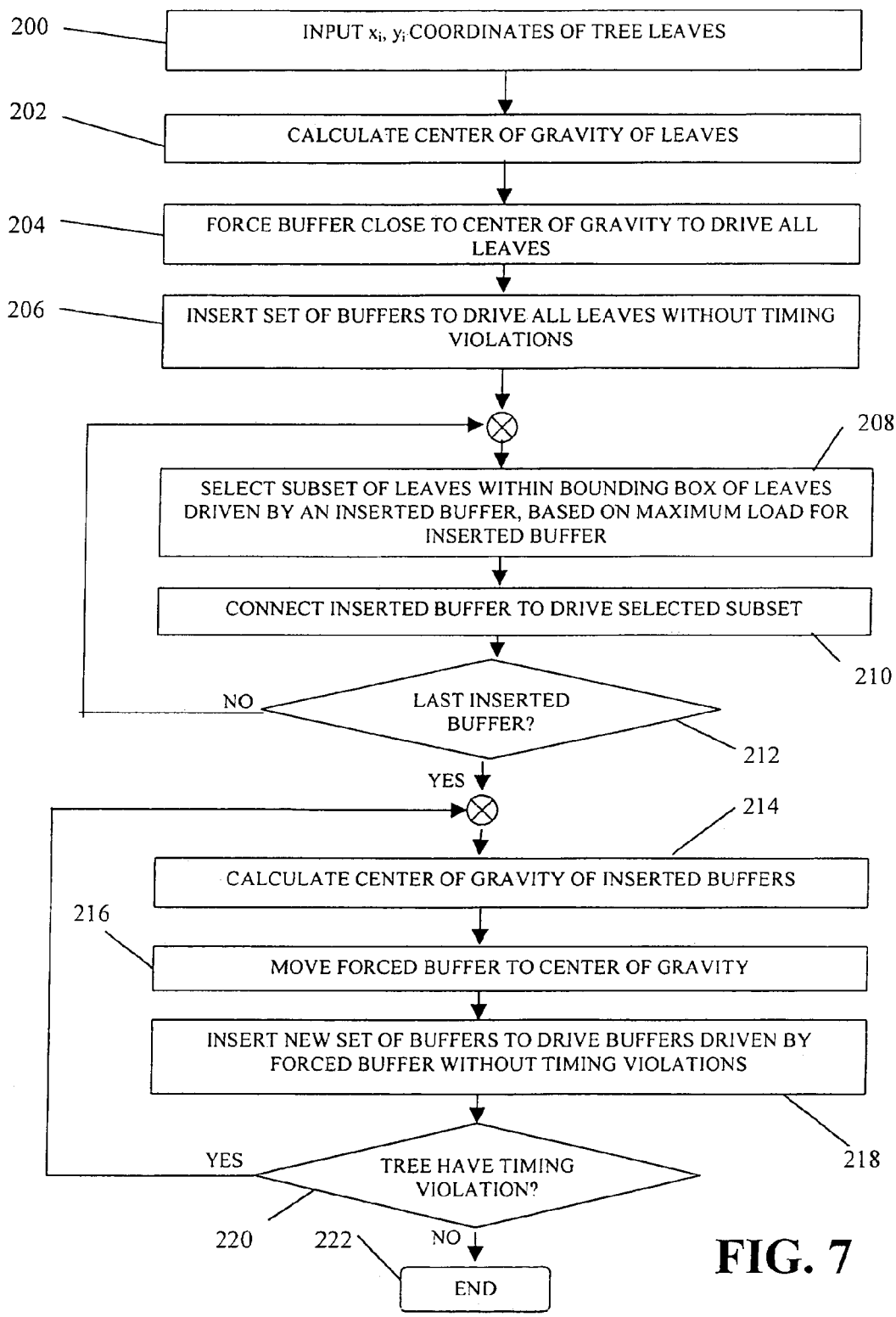
FIG. 7 is a flowchart of a process for constructing a net using timing analysis in accordance with the present invention.

FIG. 7 is a flowchart of a process of implementing a clock network and inserting buffers so that the clock uncertainty can be reduced. More particularly, the process of FIG. 7 maximizes the common path(s), thereby minimizing clock uncertainty. The process of FIG. 7 is a modification of that described in U.S. Pat. No. 6,487,697 granted to Lu et al. on Nov. 26, 2002 for "Distribution Dependent Clustering in Buffer Insertion of High Fanout Nets" and assigned to the same assignee as the present invention. For a given a clock net, the driver pin of the net is treated as the tree root and all driven pins of the net are considered as the tree leaves. Assume there are M leaves in the net, identified as 1, 2, . . . , M.

At step 200 the coordinates of each tree leaf are input to the process as $(x_i, y_i)$, where $i \in (1, 2, \ldots, M)$. At step 202, the center of gravity $(x, y)$ of the leaves is calculated as $$x = \left(\sum_{i=1}^{M} x_i\right) / M$$

and $$y = \left(\sum_{i=1}^{M} y_i\right) / M.$$

At step 204, a buffer is forced into a free space location close to $(x, y)$, namely a location near the center of gravity of the leaves where there is sufficient free space for the buffer. "Forcing a buffer" means that no timing information or ramptime information will be considered. The forced buffer is arranged to drive all tree leaves.

At step 206, a set of buffers is inserted to drive all tree leaves. The set of buffers are inserted so that the new nets introduced by the inserted buffers do not have any ramptime violations. At step 208, a set of leaves within the bounding box of one of the inserted buffers is selected. The selected set of leaves are all those leaves that are driven by the selected one inserted buffer. A subset of the set is selected based on the drive capability of the inserted buffer, namely the maximum load that the inserted buffer can drive without causing ramptime violation. Preferably, priority is given to the inclusion within the subset of leaves between which there are timing paths. At step 210, the inserted buffer is then connected to drive the selected subset of leaves.

At step 212, if additional inserted buffers exist for which steps 208–210 have not been performed, the process loops back and iteratively performs steps 208 and 210 for each inserted buffer. When the last inserted buffer has been processed, as identified at step 212, then at step 214 the center of gravity of the inserted buffers is calculated.

For example, if there are K new inserted buffers such that each k-th buffer is inserted at respective coordinates $(x_k, y_k)$. The center of gravity of the K buffers is calculated as $$x = \left\{\sum_{k=1}^{K} x_k / K\right\}, y = \left\{\sum_{k=1}^{K} y_k / K\right\}.$$

AT step 216 the forced buffer inserted at step 204 is moved to this new center of gravity.

At step 218 another set of buffers is inserted to drive those buffers currently driven by the forced buffer such that all new nets driven by inserted buffers do not have an ramptime violation. At step 220 the net is tested to identify if the tree has any ramptime violations. If ramptime violations exist, the process loops back to step 214 to repeat steps 214–218 until no ramptime violations remain. The process then ends at step 220 with an implemented net having placed cells and routed wires.

The process of FIG. 7 places the forced buffer at the center of gravity of the clock network. Consequently, the common path to the forced buffer is maximized, thereby minimizing the non-common paths and minimizing clock uncertainty, which may be calculated as described in connection with FIG. 5.

The process is preferably carried out in a computer, with a memory medium, such as a recording disk of a disk drive, having a computer readable program therein containing computer readable program code that causes the computer to calculate the uncertainty parameter and carry out the processes of the invention. In preferred embodiments, the process is carried out in a computer in conjunction with an optimizing tool used during synthesis of the integrated circuit design.

Although the present invention has been described with reference to preferred embodiments, workers skilled in the art will recognize that changes may be made in form and detail without departing from the spirit and scope of the invention.

What is claimed is:

1. A process for estimating clock uncertainty between a receiving cell and a launching cell of a net, comprising steps of:

a) back-tracing a first path from the receiving cell toward a clock source and marking each cell having a predetermined characteristic along the first path;
   b) back-tracing a second path from the launching cell toward the clock source to common one of the marked cells having the predetermined characteristic; and
   c) calculating clock uncertainty based on a delay associated with the first path between the common marked cell and the receiving cell.

2. The process of claim 1, wherein the launching and receiving cells are data launching and receiving cells, the process includes:
   identifying a first clock delay between the clock source and the launching cell,
   identifying a second clock delay between the clock source and the receiving cell,
   identifying a data delay between the launching cell and the receiving cell,
   calculating a slack based on the first and second clock delays and the data delay, and
   calculating clock uncertainty if the slack does not exceed a predetermined value.

3. The process of claim 2, further including:
   calculating a common clock delay between the clock source and the common marked cell, and
   calculating clock uncertainty based on the second clock delay and the common clock delay.

4. The process of claim 3, wherein the clock uncertainty is a factor of a difference between the second clock delay and the common clock delay.

5. The process of claim 1, further including:
   calculating a common clock delay between the clock source and the common marked cell,
   identifying a second clock delay between the clock source and the receiving cell, and
   calculating clock uncertainty based on the second clock delay and the common clock delay.

6. The process of claim 1, wherein the launching and receiving cells are data launching and receiving cells and there are a plurality of data launching cells providing a plurality of data paths to one data receiving cell, the process further comprising:
   d) repeating steps b) and c) for each data launching cell to derive a clock uncertainty associated with each launching cell and the receiving cell, and
   e) selecting a maximum value of clock uncertainty derived in step d) as a clock uncertainty for the receiving cell.

7. The process of claim 6, further including:
   identifying a first clock delay between the clock source and the launching cell,
   identifying a second clock delay between the clock source and the receiving cell,
   identifying a data delay between the launching cell and the receiving cell,
   calculating a slack based on the first and second clock delays and the data delay, and
   calculating clock uncertainty if the slack does not exceed a predetermined value.

8. The process of claim 7, further including:
   calculating a common clock delay between the clock source and the common marked cell, and
   calculating clock uncertainty based on the second clock delay and the common clock delay.

9. The process of claim 6, further including:
   calculating a common clock delay between the clock source and the common marked cell, identifying a second clock delay between the clock source and the receiving cell, and calculating clock uncertainty based on the second clock delay and the common clock delay.

10. A computer useable medium having a computer readable program embodied therein for addressing data to estimate clock uncertainty between a data receiving cell and a data launching cell of a net, the computer readable program comprising:

computer readable program code for causing the computer to back-trace a first path from the data receiving cell toward a clock source and mark each intermediate cell having a predetermined characteristic along the first path;

computer readable code for causing the computer to back-trace a second path from the data launching cell toward the clock source to a common of the marked cells having the predetermined characteristic; and computer readable code for causing the computer to calculate clock uncertainty based on a delay associated with the first path from the common marked intermediate cell to the data receiving cell.

11. The computer useable medium of claim 10, wherein the launching and receiving cells are data launching and receiving cells, wherein the computer readable program further includes:

computer readable code for causing the computer to identify a first clock delay between the clock source and the launching cell, computer readable code for causing the computer to identify a second clock delay between the clock source and the receiving cell, computer readable code for causing the computer to identify a data delay between the launching cell and the receiving cell, computer readable code for causing the computer to calculate a slack based on the first and second clock delays and the data delay, and computer readable code for causing the computer to calculate clock uncertainty if the slack does not exceed a predetermined value.

12. The computer useable medium of claim 11, further including:

computer readable code for causing the computer to calculate a common clock delay between the clock source and the common marked cell, and computer readable code for causing the computer to calculate clock uncertainty based on the second clock delay and the common clock delay.

13. The computer useable medium of claim 12, wherein the clock uncertainty is a factor of a difference between the second clock delay and the common clock delay.

14. The computer useable medium of claim 11, wherein there are a plurality of data launching cells providing a plurality of data paths to one data receiving cell, wherein the computer readable program further includes:

computer readable code for causing the computer to repeat execution of the computer readable codes that cause the computer to back-trace a second path and calculate clock uncertainty for each data launching cell to derive a clock uncertainty associated with each launching cell and the receiving cell, and computer readable code for causing the computer to select a maximum value of the derived clock uncertainties as a clock uncertainty for the receiving cell.

* * * * *